United States Patent
Killat

(10) Patent No.: US 7,514,999 B2
(45) Date of Patent: Apr. 7, 2009

(54) VOLTAGE-TO-CURRENT CONVERTER

(75) Inventor: Dirk Killat, Kirchheim/Teck (DE)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 383 days.

(21) Appl. No.: 11/403,735

(22) Filed: Apr. 13, 2006

(65) Prior Publication Data

US 2007/0229161 A1 Oct. 4, 2007

(30) Foreign Application Priority Data

Apr. 4, 2006 (EP) .................................. 06392006

(51) Int. Cl.
 *H03F 3/45* (2006.01)
(52) U.S. Cl. .................................... 330/260
(58) Field of Classification Search .............. None
 See application file for complete search history.

(56) References Cited

U.S. PATENT DOCUMENTS

| | | | |
|---|---|---|---|
| 4,965,529 A * | 10/1990 | Laug | 330/255 |
| 5,043,652 A | 8/1991 | Rybicki et al. | |
| 5,227,795 A | 7/1993 | Yamakido et al. | |
| 6,060,870 A | 5/2000 | Seevinck | |
| 6,111,463 A * | 8/2000 | Kimura | 330/254 |
| 6,369,730 B1 | 4/2002 | Blanken et al. | |
| 6,704,560 B1 * | 3/2004 | Balteanu et al. | 455/333 |
| 7,002,501 B2 | 2/2006 | Gulati et al. | |
| 7,250,886 B1 * | 7/2007 | Killat et al. | 341/143 |

| | | |
|---|---|---|
| 2005/0275575 A1 | 12/2005 | Motz |

FOREIGN PATENT DOCUMENTS

| | | |
|---|---|---|
| EP | 0 208 365 A1 | 1/1987 |
| EP | 0 620 513 A1 | 10/1994 |
| JP | 2002026666 | 1/2002 |
| WO | WO 03/038994 A1 | 5/2003 |

OTHER PUBLICATIONS

"A 10μV-Offset 8KHz Bandwidth 4th—Order Chopped Sigma Delta A/D Converter for Battery Management", by Peter G. Blanken et al., ISSCC 2002/Session 23.Analog Techniques/ 23.5, 2002 IEEE, Int'l Solid-State Circuits Conf., pp. 23.5-23.5.7.
Outline of A/D Converter Specifications, 2002 IEEE Int'l Solid-State Circuits Conference, 2002 IEEE, 19 pages.
Co-pending U.S. Appl. No. 11/384,760, filed Mar. 20, 2006, "Sigma-Delta Modulator", assigned to the same assignee as the present invention.

* cited by examiner

*Primary Examiner*—Robert Pascal
*Assistant Examiner*—Krista M Flanagan
(74) *Attorney, Agent, or Firm*—Saile Ackerman LLC; Stephen B. Ackerman

(57) ABSTRACT

Circuits and methods to achieve a voltage-to-current converter having low noise and a high linearity are disclosed. In a preferred embodiment the converter has been used as a Gm integrator. The core of the invention is an operational transconductance amplifier (OTA) having additional DC current sources allowing a common mode voltage shift. The feedback currents and output currents are decoupled by means of current mirrors. The feedback currents are higher than the output currents thus allowing lower integration resistor size. A common mode decoupling of input and output has been achieved by current mirrors.

20 Claims, 3 Drawing Sheets

VOLTAGE-TO-CURRENT CONVERTER

This application is related to U.S. patent application Ser. No. 11/384,760, filed Mar. 20, 2006, by the same inventor and assigned to the same assignee as the present invention. Title: "Sigma-Delta Modulator"

BACKGROUND OF THE INVENTION (1) Field of the Invention

This invention relates generally to voltage-to-current converters and relates more particularly to voltage-to-current converters circuits having very low noise and low Gm transconductance for applications as e.g. integrator circuits required in sigma-delta modulators.

(2) Description of the Prior Art

Voltage-to-current converters are required if an input voltage from e.g. any measurement device has to be converted to a current to drive a device depending on the current injected into or sunk through its input. Such a device depending upon a current injected could be an integrating capacitor of a Gm integrator. Gm integrators are often employed in measuring technology e.g. in connection with sigma-delta modulators. In this context it is very important to achieve very low noise and low Gm transconductance together with a high linearity. For these linearity requirements it is necessary to use integration resistors with a Gm integrator.

It is a challenge for the designers of voltage-to-current converters used e.g. as Gm integrators in sigma-delta modulators to achieve low noise and low offset continuous time Gm integrators combining small integration resistors and high linearity, together with small chip size and a very low clock frequency There are more known patents dealing with the design of integrator circuits.

(U.S. Pat. No. 7,002,501 to Gulati et al.) proposes a reconfigurable ADC including a plurality of reconfigurable blocks for allowing the ADC to provide a plurality of architectures. In one embodiment, the ADC can be configured to operate in a pipeline mode and a sigma-delta mode. This arrangement provides an ADC having a relatively large range of bandwidth and resolution.

(U.S. Pat. No. 5,227,795 to Yamakido et al.) discloses an over-sampling analog-to-digital converter using a current switching circuit as a local digital-to-analog converter, wherein a difference between the output currents of a voltage-to-current converter circuit and a current switching circuit is integrated by a capacitor of which the one end is grounded to a dc potential. Further, the current switching circuit has many bits to decrease the difference current between the signal current and the feedback current signal. Moreover, the level-shifting function of the voltage-to-current converter circuit makes it possible to apparently subtract the dc component from the input analog signal, which is produced based on an internally generated dc voltage as a dc bias voltage, and to decrease a change in the voltage between the electrodes of a capacitor caused by the integration of current.

U.S. Patent Application Publication (2005/0275575 to Motz) discloses an integrator circuit having an integrator unit performed to generate an integrated signal from a modulated input signal. Additionally, the integrator circuit has an error feedback coupler connected to an output of the integrator unit and to an input of the integrator unit and formed to determine an error component from the integrated signal or from a signal derived from the integrated signal and to compensate the error component via the feedback in the modulated input signal.

SUMMARY OF THE INVENTION

A principal object of the present invention is to achieve methods and circuits for a low noise and high linear voltage-to-current converter.

A further object of the present invention is to achieve voltage-to-current converter requiring only small integration resistors.

In accordance with the objects of this invention a method to achieve a voltage-to-current converter having a high linearity and low noise has been achieved. The method comprises, first, the provision of an operational transconductance amplifier (OTA), resistive means for integration, DC current sources, and current mirrors. The next step of the method is shifting the level of the input voltages so far above ground voltage that input transistors of the OTA are kept in saturation mode. The last step is feeding back the output current to input current using current mirrors wherein the feedback current is larger than the output current.

In accordance with the objects of this invention a circuit for a voltage-to current converter having low noise and low transconductance has been achieved. The circuit invented comprises, first, a positive and a negative input voltage, and circuitry to shift said input voltages higher to enable an input stage of a differential operational transconductance amplifier (OTA) to operate in saturation mode for MOS devices. The core of the present invention is said differential OTA. This OTA comprises a circuitry for common mode decoupling of input from output wherein active loads are regulated in a way to achieve a correct output common mode voltage, and a positive and a negative output connected to a load, wherein these outputs have a transconductance in the order of magnitude of 1 Gm. Furthermore the OTA comprises a positive and a negative output fed back to said correspondent input stages of the OTA, wherein these positive and negative outputs have a significant higher transconductance than said outputs being connected to said load and wherein said outputs fed back and outputs to said load are decoupled by means of current mirrors.

In accordance with further objects of this invention a circuit for a voltage-to current converter having low noise and low transconductance has been achieved. The circuit invented comprises, first, a positive and a negative input voltage, a first circuitry connected between said positive input voltage and a gate of a first NMOS input transistor of a differential operational transconductance amplifier (OTA) to shift said input voltage higher to enable said first NMOS input transistor and a first current source to operate in saturation mode for MOS devices, a second circuitry connected between said negative input voltage and a gate of a second NMOS input transistor to shift said input voltage higher to enable said second NMOS input transistor and a first current source to operate in saturation mode for MOS devices. Said OTA is the core of the present invention comprising said first NMOS input transistor, wherein its drain is connected to the drain and the gate of a first PMOS transistor, to the gate of a second PMOS transistor, and to the gate of a third PMOS transistor, and its gate is connected to the drain of a sixth PMOS transistor and to the drain of a seventh PMOS transistor, and said second NMOS input transistor, wherein its drain is connected to the drain and the gate of a fourth PMOS transistor, to the gate of a fifth PMOS transistor, and to the gate of the sixth PMOS transistor, and wherein its gate is connected to the drain of the third PMOS transistor and to the drain of a eighth PMOS transistor. Said first current source is connected between ground and the sources of said first and second NMOS transistors. The sources of the first to eighth PMOS transistors are connected to VDD voltage. The drain of the second PMOS transistor is connected to a positive terminal of a load and to a first terminal of a second current source, and the drain of a fifth PMOS transistor is connected to a negative terminal of a load and to a first terminal of a third current source. The gate of a seventh PMOS transistor is connected to a bias voltage and to a gate of the eighth PMOS transistor. Finally the OTA comprises said second and third current source, wherein their second terminals are connected to ground.

BRIEF DESCRIPTION OF THE DRAWINGS

In the accompanying drawings forming a material part of this description, there is shown.

DESCRIPTION OF THE PREFERRED EMBODIMENTS

The preferred embodiments disclose methods and circuits for voltage-to-current converters used e.g. as Gm integrators having a high linearity without requiring large integration resistors, which produce white noise. In a preferred embodiment such Gm integrators are used with a delta-sigma modulator for battery management as disclosed in, U.S. patent application docket number DS05-020, Ser. No. 11/384,760, filed Mar. 20, 2006. While the present invention was developed by paying special attention to the possible use of a Gm integrator of a sigma-delta modulator, reference to this use is not to be construed as limiting the scope of this invention. The principle of the methods and circuits invented can be used also for many other voltage-to-current conversion applications requiring high linearity.

The preferred embodiments have been implemented in an integrated circuit (IC) using CMOS-technology; other semiconductor technologies are also possible.

Figure 1:
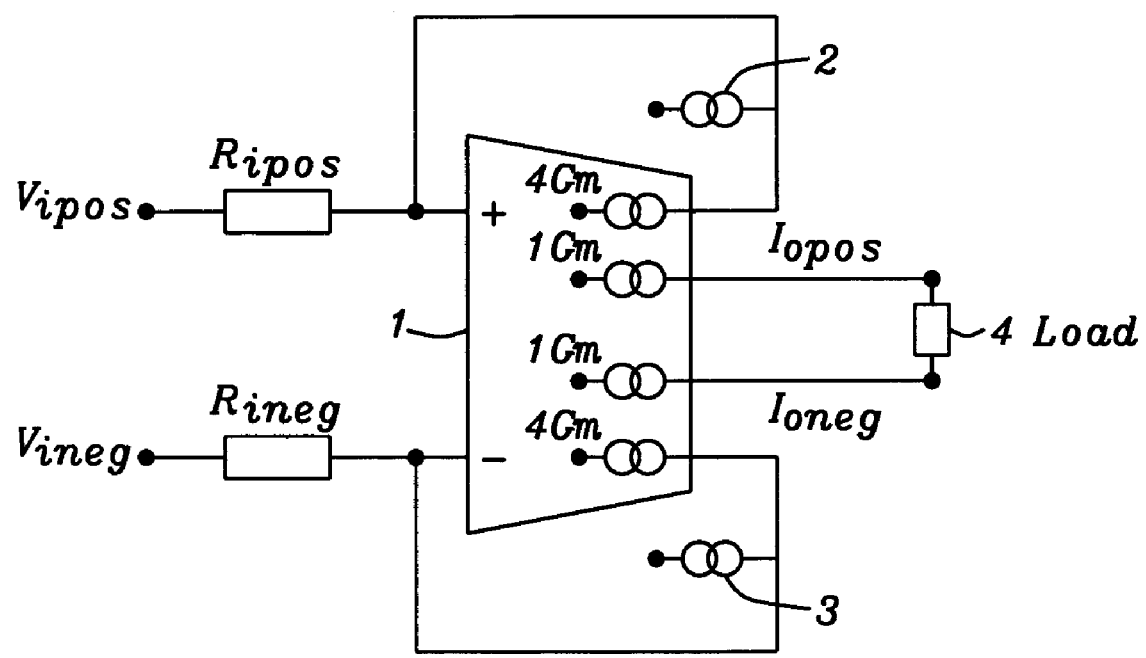
FIG. 1 shows a schematic block diagram of the voltage-to-current converter invented.

FIG. 1 shows a schematic illustration of a preferred embodiment of the present invention. At the positive input of the voltage-to-current converter used as differential Gm integrator 1 is voltage $V_{IPOS}$, at the negative input is voltage $V_{INEG}$. For linearization of the Gm integrator 1 integration resistors $R_{IPOS}$ and $R_{INEG}$ are used. The linearization can be performed either by means of resistors either in the source path of the input transistor pair, or by using resistors in the input branch shown in FIG. 1. Alternatively MOS transistors operated in the linear region (acting like a resistor, not as a current source), could be used instead of these integration resistors $R_{IPOS}$ and $R_{INEG}$.

The $G_m$ integrator 1 is realized by an operational transconductance amplifier (OTA), which has a first nominal output of 1 Gm and a second output of $4 \cdot G_m$. The output with the nominal $G_m$ is connected to a load 4. In case the voltage-to-current converter is a Gm integrator this load would be an integration capacitor. The voltage-to-current converter of the present invention can be used to provide a linear current for a multitude of different loads as any device depending on the current injected into or sunk through its input. The additional $4 \cdot G_m$ output is fed back, due to the high feedback current allowing a significant reduction of the size of the integration resistors $R_{IPOS}$ and $R_{INEG}$. Additional DC current sources 2 and 3 with equal sign for positive and negative feedback path perform the DC level shift from the differential input tied between VSS and the differential input of the OTA. Other ratios of feedback current to integration current are also possible.

Figure 2:
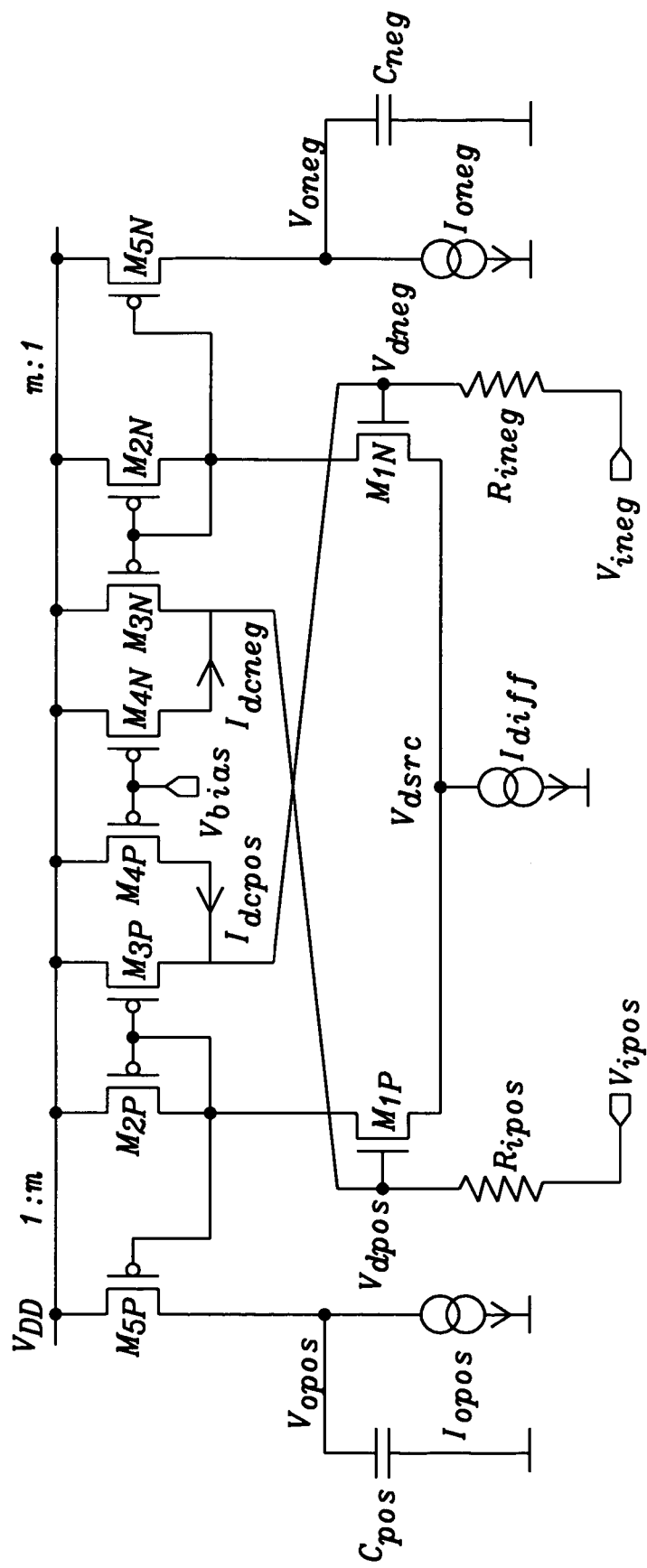
FIG. 2 shows a detailed circuit diagram of a preferred embodiment of the voltage-to-current converter invented used as a Gm integrator.

FIG. 2 shows a more detailed circuit diagram of a preferred embodiment of a voltage-to-current converter used as Gm integrator having low noise and a high linearity. The input voltage is applied at $V_{IPOS}$ and $V_{INEG}$. The input voltages are level shifted to $V_{DPOS}$ and $V_{DNEG}$ by using the resistors $R_{IPOS}$ and $R_{INEG}$ and a current flowing through these resistors. The currents through the resistors are composed of a DC component $I_{DCPOS}$ and $I_{DCNEG}$, and a current that is proportional to the integration current that is derived from the current mirror of the input stage to the output stage. Transistors $M_{1P}$, $M_{1N}$, $M_{2P}$, $M_{2N}$ belong to the input stage. The other transistors belong to the feedback path ($M_{3P}$, $M_{3N}$,) or the output stage or output path ($M_{5P}$, $M_{5N}$,).

The advantage of the level shift is that the voltages $V_{DPOS}$ and $V_{DNEG}$ are so far above ground voltage, that the input transistors $M_{1P}$, $M_{1N}$, and the current source $I_{DIFF}$ are kept in normal operation, that is saturation mode for MOS devices, even if enhancement MOS devices with threshold voltages ($V_{TH}$) above zero are used. The additional constant DC current source IDIFF overlays the signal dependent current.

The voltage VBIAS is the gate node of the current mirror $M_{4P}$ to $M_{4N}$. VBIAS is preferably connected to a PMOS transistor with same channel length as $M_{4P}$ to $M_{4N}$, whereas this transistor has gate and drain shorted and a current is forced through this device to generate the voltage VBIAS.

The core of the disclosed voltage-to-current converter used as Gm integrator is an OTA comprising the input transistors $M_{1P}$, $M_{1N}$, the output current mirrors $M_{2P}$ to $M_{5P}$ and $M_{2N}$ to $M_{5N}$, and active loads $I_{OPOS}$ and $I_{ONEG}$ connected to the output nodes $V_{OPOS}$ and $V_{ONEG}$. The active loads $I_{OPOS}$ and $I_{ONEG}$ are regulated in a way to achieve the correct output common mode voltage.

Usually a circuit called "Common mode regulation" (CMR) is used to adjust the active loads $I_{OPOS}$ and $I_{ONEG}$. This CMR circuit calculates the average of both output voltages and compares this value with a given reference common mode voltage. The difference between actual common mode voltage and the given reference is used to regulate the active load. Usually both current sources $I_{OPOS}$ and $I_{ONEG}$ are identical as they do not contribute to the differential component of the output voltage.

The output currents ILP and ILN are integrated on the capacitors $C_{POS}$ and $C_{NEG}$. Alternatively a capacitor having one terminal connected with node $V_{OPOS}$ and one terminal connected to node $V_{ONEG}$ could be used as integration capacitor.

For any other application of the voltage-to-current converter of the present invention a load could be connected between node $V_{OPOS}$ and node $V_{ONEG}$. The output current between both nodes could be input current to any other current driven devices.

The current mirrors $M_{2P}$ to $M_{5P}$ and $M_{2N}$ to $M_{5N}$ can have a ratio smaller than 1 to establish a very small transconductance if required.

A problem with very small transconductances is that it will require very large resistors, which cost a lot of area in most CMOS technologies, and which increases the thermal noise level due to the well known formula $V_n = 4 \cdot k \cdot T \cdot R$. The circuit disclosed here uses a second set of current mirrors $M_{2P}$ to $M_{3P}$ and $M_{2N}$ to $M_{3N}$, with a ratio larger or different to the output current mirrors, to feed a larger current back to the resistors $R_{IPOS}$ and $R_{INEG}$ that specify or impact the transconductance. (The total transconductance is not only specified by the resistors, but also from the dimensioning of the other parts of the circuit). Due to the high currents through the resistors R$_{IPOS}$ and R$_{INEG}$ can kept small. The resistors linearize the transconductance of the input stage M$_{1P}$ and M$_{1N}$.

The key feature of the circuit is that the integration current and the feedback current can be adjusted independently from each other by adjusting the ratio of the related current mirrors. This makes very small transconductances possible, without excessive increase of thermal noise of the resistors that control the transconductance.

The exact value of Gm can be determined by the design parameters (W/L) of the input transistors of the OTA, or accordingly by using linearization resistors inside or outside the OTA.

Figure 3:
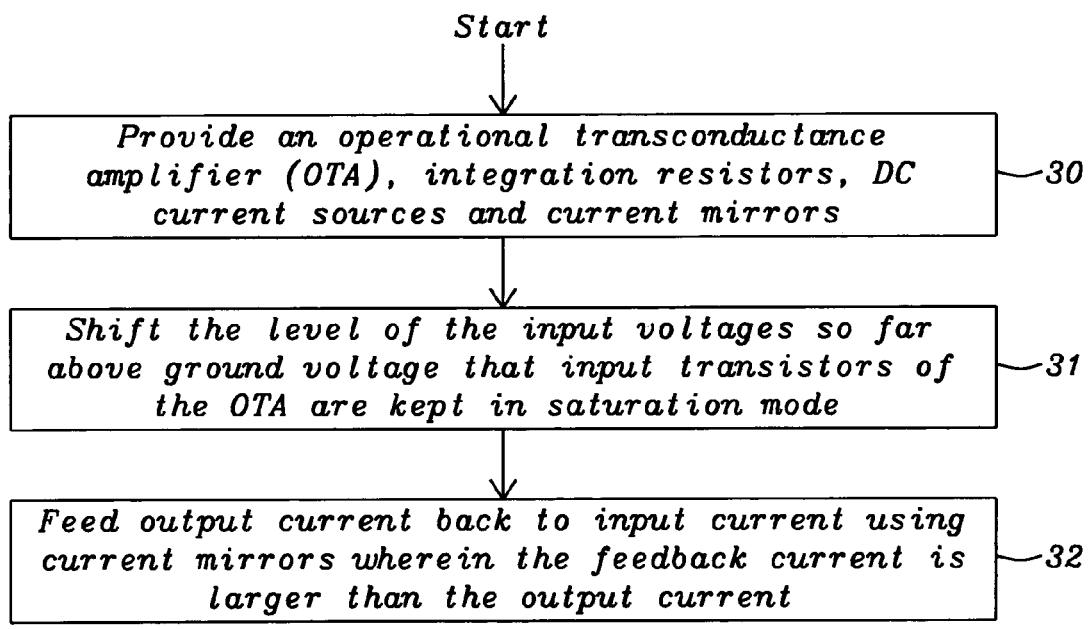
FIG. 3 shows a flowchart of a method to achieve a voltage-to-current converter having low noise and low transconductance.

FIG. 3 shows a flowchart of a method to achieve a voltage-to-current converter having a high linearity and low noise. Step 30 of the method invented illustrates the provision of an operational transconductance amplifier (OTA), integration resistors, DC current sources and current mirrors The following step 31 shows the shifting of the level of the input voltages so far above ground voltage that input transistors of the OTA are kept in saturation mode. The shifting of the input voltages can be performed by said integration resistors and a high current. The last step 32 describes the feedback of the output current to input current using current mirrors wherein the feedback current is larger than the output current. For example in the preferred embodiment shown in FIG. 1 the feedback current is 4×times larger than the output current.

While the invention has been particularly shown and described with reference to the preferred embodiments thereof, it will be understood by those skilled in the art that various changes in form and details may be made without departing from the spirit and scope of the invention.

What is claimed is:

1. A method to achieve a voltage-to-current converter having a high linearity and low noise comprising:
    providing an operational transconductance amplifier (OTA), resistive means for integration, DC current sources, and current mirrors;
    shifting the level of input voltages, using said resistive means, so far above ground voltage that input transistors of the OTA are kept in saturation mode; and
    feeding back output current, generated by said OTA, to input current using current mirrors wherein the feedback current is larger than the output current and said current sources provide common mode voltage shift.

2. The method of claim 1 wherein said resistive means for integration are resistors.

3. The method of claim 1 wherein said resistive means for integration are transistors.

4. The method of claim 1 wherein said current mirrors are deployed in a way that the ratio between the integration current and the feedback current can be selected independently of each other by suitable adjustment of the ratios of said current mirrors.

5. The method of claim 1 wherein said voltage-to-current converter is used as a Gm integrator, wherein the output currents of said voltage-to-current converter are used to charge at least one integration capacitor.

6. The method of claim 1 wherein active loads are added to the output currents.

7. The method of claim 6 wherein said active loads are regulated in a way to achieve a correct output common mode voltage.

8. The method of claim 7 wherein a "Common mode regulation" (CMR) circuit is used to adjust said active loads by calculating the average of both output voltages and comparing this value with a given reference common mode voltage.

9. A circuit for a voltage-to current converter having low noise and low transconductance comprising:
    a positive and a negative input voltage;
    circuitry to shift said input voltages higher to enable an input stage of a differential operational transconductance amplifier to operate in saturation mode for MOS devices;
    said differential operational transconductance amplifier (OTA) comprising:
    circuitry for common mode decoupling of input from output wherein active loads are regulated in a way to achieve a correct output common mode voltage;
    a positive and a negative output connected to a load wherein these outputs have a transconductance in the order of magnitude of 1 Gm; and
    a positive and a negative output fed back to said correspondent input stages of the differential transconductance amplifier, wherein these positive and negative outputs have a significant higher transconductance than said outputs being connected to said load and wherein said outputs fed back and outputs to said load are decoupled by means of current mirrors.

10. The circuit of claim 9 wherein said load is an integration capacitor.

11. The circuit of claim 9 wherein said circuitry to shift said input voltages higher comprises resistive means wherein a first resistive means is connected between said positive input voltage and a positive input port of said differential operational transconductance (OTA) amplifier and a second resistive means is connected between said negative input voltage and a negative input port of said differential operational transconductance (OTA) amplifier 12. The circuit of claim 11 wherein said first and second resistive means are resistors.

13. The circuit of claim 9 wherein said active loads are current sources wherein a first current source is connected between ground and positive output to the load and a second current source is connected between ground and negative output to the load.

14. A circuit for a voltage-to current converter having low noise and low transconductance comprises:
    a positive and a negative input voltage;
    a first circuitry connected between said positive input voltage and a gate of a first NMOS input transistor of a differential operational transconductance (OTA) amplifier to shift said input voltage higher to enable said first NMOS input transistor and a first current source to operate in saturation mode for MOS devices;
    a second circuitry connected between a negative input and a gate of a second NMOS input transistor to shift said input voltage higher to enable said second NMOS input transistor and said first current source to operate in saturation mode for MOS devices;
    said differential operational transconductance amplifier (OTA) comprising:
        said first NMOS input transistor wherein its drain is connected to the drain and the gate of a first PMOS transistor, to the gate of a second PMOS transistor, and to the gate of a third PMOS transistor, and wherein its gate is connected to the drain of a sixth PMOS transistor and to the drain of a seventh PMOS transistor;
        said second NMOS input transistor, wherein its drain is connected to the drain and the gate of a fourth PMOS transistor, to the gate of a fifth PMOS transistor, and to the gate of the sixth PMOS transistor, and wherein its gate is connected to the drain of the third PMOS transistor and to the drain of a eighth PMOS transistor;

said first current source being connected between ground and the sources of said first and second NMOS transistors;

said first PMOS transistor, wherein its source is connected to VDD voltage;

said second PMOS transistor, wherein its source is connected to VDD voltage and its drain is connected to a positive terminal of a load and to a first terminal of a second current source;

said third PMOS transistor, wherein its source is connected to VDD voltage;

said fourth PMOS transistor, wherein its source is connected to VDD voltage;

said fifth PMOS transistor, wherein its source is connected to VDD voltage and its drain is connected to a negative terminal of a load and to a first terminal of a third current source;

said sixth PMOS transistor, wherein its source is connected to VDD voltage;

said seventh PMOS transistor, wherein its source is connected to VDD voltage and its gate is connected to a bias voltage and to a gate of the eighth PMOS transistor;

said eighth PMOS transistor, wherein its source is connected to VDD voltage;

said second current source, wherein its second terminal is connected to ground; and said third current source, wherein its second terminal is connected to ground.

15. The circuit of claim 14 wherein said first and second circuitry to each comprise resistive means.

16. The circuit of claim 15 wherein said resistive means are resistors.

17. The circuit of claim 15 wherein said resistive means are transistors operated in a linear region.

18. The circuit of claim 14 wherein said first PMOS transistor and said second PMOS transistor form a first current mirror and said fourth and fifth PMOS transistors form a second current mirror, wherein both current mirrors have a same ratio 1:m, hence the currents through the first and fourth PMOS transistors are much higher than the currents through their correspondent second and fifth PMOS transistors.

19. The circuit of claim 14 wherein said current mirror ratio is 1:4.

20. The circuit of claim 11 wherein said first and second resistive means are transistors.

* * * * *